United States Patent

Holliday et al.

[11] Patent Number: 5,417,577
[45] Date of Patent: May 23, 1995

[54] INTERCONNECTION METHOD AND APPARATUS

[75] Inventors: Albert Holliday, Langhorne; Maureen B. Schmidt, Fairless Hills, both of Pa.; Fred W. Verdi, Lawrenceville, N.J.

[73] Assignee: AT&T Corp., Murray Hill, N.J.

[21] Appl. No.: 96,880

[22] Filed: Jul. 26, 1993

Related U.S. Application Data

[63] Continuation of Ser. No. 948,542, Sep. 23, 1992, abandoned.

[51] Int. Cl.⁶ .................................................. H01R 4/58
[52] U.S. Cl. ........................................ 439/91; 439/66; 361/785; 361/779; 29/830
[58] Field of Search .................. 29/830; 361/397, 409, 361/412, 413; 439/66, 91

[56] References Cited

U.S. PATENT DOCUMENTS

| | | | |
|---|---|---|---|
| 3,795,845 | 3/1974 | Cass et al. | 257/786 |
| 4,252,391 | 2/1981 | Sado | 439/91 X |
| 4,357,062 | 11/1982 | Everett | 339/18 R |
| 4,707,657 | 11/1987 | Boegh-Peterson | 324/158 F |
| 5,046,953 | 9/1991 | Shreeve et al. | 439/66 X |
| 5,142,775 | 9/1992 | Wiley | 29/830 X |

*Primary Examiner*—Mark Rosenbaum
*Assistant Examiner*—Khan V. Nguyen
*Attorney, Agent, or Firm*—Robert B. Levy

[57] ABSTRACT

An improved electrical connection between each of a set of metallized areas (16) on a first substrate (11) and those on a second substrate (12), via a layer of anisotropically conductive material (22) sandwiched therebetween, is obtained by arraying the metallized areas in concentric rings about each of a plurality of fasteners (28) extending through both substrates and the material. By arraying the metallized areas in concentric rings about each fastener, the anisotropically conductive material in contact with the metallized areas arrayed in each ring will advantageously be subjected to a uniform pressure by the fastener, improving the conductivity of the material.

6 Claims, 1 Drawing Sheet

INTERCONNECTION METHOD AND APPARATUS

This is a continuation of application Ser. No. 07/948,542, filed on Sep. 23, 1992, abandoned.

TECHNICAL FIELD

This invention relates to a technique for electrically connecting each of a set of metallized areas on one substrate to a corresponding area on another substrate via at least one layer of anisotropically conductive material sandwiched between them.

BACKGROUND OF THE INVENTION

Traditionally, an electrical connection between each of a plurality of metallized areas on one substrate, (i.e., a circuit board) and each of a plurality of areas on another substrate has been accomplished by way of one or more cables. Typically, each cable has each of its ends terminated with a connector adapted to mate with a corresponding connector on each circuit board. The disadvantage with this approach is that the cost associated with the connectors is relatively high, as is the effort required to install each connector at each cable end. For this reason, much effort is being devoted to exploring lower cost interconnection alternatives.

Instead of using cables, an electrical connection between the metallized areas on one circuit board and those on the other can be accomplished by arranging the boards in opposing relationship and then sandwiching one or more layers of anisotropically conductive material between them. The anisotropically conductive material used for this purpose is characterized by very good electrical conductivity along its thickness (z axis) direction but very poor electrical conductivity throughout its bulk (x-y) direction. Anisotropically conductive materials having this property are typically manufactured by arranging a plurality of electrically conductive members, (i.e., wires or chains of conductive particles) in a non-conductive matrix (i.e., silicone rubber or the like) so that the conductive members extend along the z axis in spaced relationship from each other. In this way, the conductive members in the non-conductive matrix provide a plurality of conductive paths in the z-axis direction only.

To maintain a good electrical connection between the metallized areas on the opposed circuit boards, the layer of anisotropically conductive material sandwiched between the boards must be uniformly compressed. To this end, one or more mechanical fasteners (e.g., screws, bolts or heat-staked pins) extend through the two circuit boards to compress the anisotropically conductive material interposed between the boards. In the past, uniform compression of the regions of the anisotropically conductive material in contact with the metallized areas on each of the opposing circuit boards has been difficult to obtain. The metallized areas on each circuit board are typically arranged in a square or rectangular array, whereas each fastener exerts concentric rings of constant pressure. Thus, unless a very large number of fasteners are employed (which increases the cost and difficulty of assembly), each region of the anisotropically conductive material in contact with a metallized area lying outside a constant pressure ring associated with a particular fastener will be subjected to less compression than the metallized areas within such a ring.

Therefore, there is a need for an interconnection technique which provides for more uniform compression of those regions of anisotropically conductive material in contact with the arrays of metallized areas on opposing circuit boards.

SUMMARY OF THE INVENTION

Briefly, a technique is provided for interconnecting one or more arrays of metallized areas on opposing substrates (i.e., circuit boards). The technique is practiced by first arranging the arrays of metallized areas on each substrate in at least one ring, and preferably a plurality of rings, each concentric about an aperture sized to receive a fastener (e.g., a screw, bolt or heat-staked pin) extending through a corresponding aperture in the other substrate. At least one layer of anisotropically conductive material is sandwiched between the metallized areas on the opposed substrates to provide a plurality of electrically conductive paths, each connecting a metallized area on one substrate with a corresponding area on the other substrate. The arrangement of the metallized areas in rings about each aperture advantageously allows the fastener extending through the aperture to exert a constant pressure on each ring of metallized areas to uniformly compress each region of anisotropically conductive material in contact therewith.

DETAILED DESCRIPTION

Figure 1:
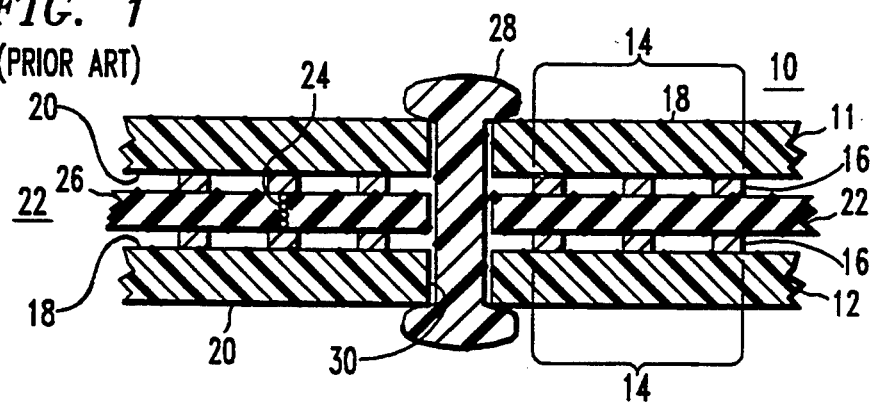
FIG. 1 is a side view, in cross-section, of a pair of opposed circuit boards having a layer of anisotropically conductive material sandwiched between them.

In FIG. 1, there is shown a side view, in cross-section, of an assembly 10 comprised of a pair of opposed substrates 11 and 12, each taking the form of a conventional circuit board, made from a material such as FR-4 or the like. The circuit boards 11 and 12 each have at least one array 14 (best seen in FIG. 2) of metallized areas 16 on at least one of its major surfaces 18 and 20. Each metallized area 16 in each array 14 on each circuit board 11 and 12 lies in direct registration with a corresponding metallized area in the array on the opposed major surface of the other circuit board.

An interconnection between each area 16 on each circuit board 11 and 12 and a corresponding area on the opposing board is obtained by interposing a layer of anisotropically conductive material 22 between them. The anisotropically conductive material 22 is characterized by good electrical conductivity (i.e., low electrical resistance) across its thickness (in the z direction) but low conductivity (i.e., high resistance) throughout its bulk (in the x-y direction). To obtain these conductivity characteristics, the material 22 is typically manufactured by arranging a plurality of conductive members 24 (i.e., wires, rods or chains of conductive particles) in a non-conductive matrix 26 (i.e., silicone rubber or the like) so the members extend in the thickness or z direction in spaced-apart relationship in the x-y direction. The spacing (pitch) between the members 24 in the x-y direction is chosen to be smaller than the spacing in the x-y direction between the metallized areas 16 in each array 14.

As may now be appreciated, the members 24, which extend in the z direction in the matrix 26, each provide a conductive path between a separate one of the metallized areas 16 on the opposed circuit boards 11 and 12. Because the members 24 are separated from each other in the non-conductive matrix 26, there is no cross-connection between them. In this way, the anisotropically conductive material 22 provides z-axis conductivity only.

To obtain good conductivity, it is important for the anisotropically conductive material 22 to be maintained in substantially uniform compression. To that end, one or more fasteners 28 (typically, screws, bolts, rivets or heat-staked pins or an adhesive joint, including but not limited to an ultrasonic weld) extend through a corresponding aperture 30 in each board and through the anisotropically conductive material 22 into the corresponding aperture in the other board. The number and kind of fasteners 28 will depend on design considerations. In practice, a plurality of alignment pins (not shown) extend through the circuit boards 11 and 12 to maintain each of the metallized areas 16 on the boards in proper registration with each other.

Figure 2:
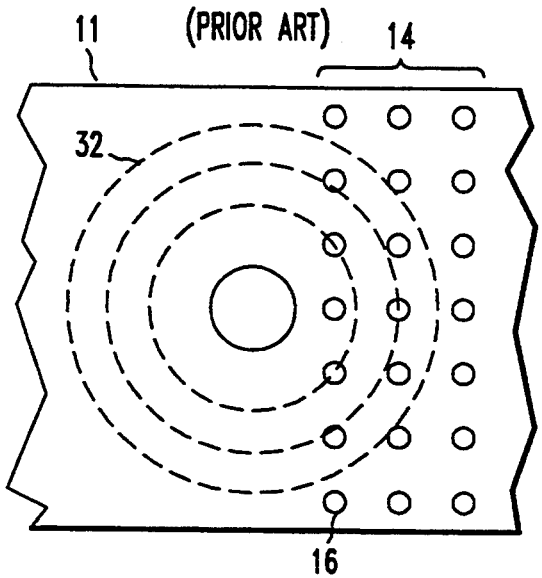
FIG. 2 is a plan view of one of the circuit boards of FIG. 1.

Referring now to FIG. 2, the array 14 of metallized areas 16 on each circuit board 11 and 12 has been traditionally made square or rectangular. When the circuit boards 11 and 12 are held in face-to-face contact with the anisotropically conductive material 22 by the fasteners 28, each fastener exerts a plurality of rings 32 of constant pressure concentric about each aperture 30. Owing to the orthogonal arrangement of the metallized areas 16 in the array 14, there are metallized areas which lie along each ring 32 of constant pressure and areas which lie outside such rings.

Those metallized areas 16 which lie outside each ring 32 are subjected to less pressure than those areas lying along the ring. Consequently, each region of anisotropically conductive material 22 sandwiched between a pair of a metallized areas 16 on the circuit boards 11 and 12 lying outside a ring 32 of constant pressure is thus subjected to less compression than a region in registration with a pair of metallized areas lying within such a constant pressure ring. The regions of anisotropically conductive material 22 subjected to such reduced compression are less conductive, causing an undesirable variation in the conductivity of the material across the arrays 14 of metallized areas 16.

Figure 3:
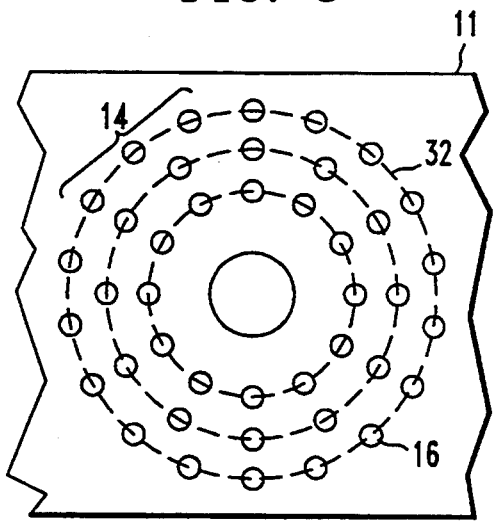
FIG. 3 is a plan view of one of the circuit boards of FIG. 1 showing an arrangement of metallized areas in accordance with the invention, for obtaining an improved electrical connection with a set of metallized areas on the other board.

Referring to FIG. 3, them is shown an improved arrangement for the metallized areas 16 on each circuit board 11, 12 to overcome the aforementioned disadvantage of non-uniform compression of the anisotropically conductive material 22 across the arrays 14 of metallized areas 16. In accordance with the invention, substantially uniform compression of the regions of anisotropically conductive material 22 (see FIG. 1) in contact with each of a pair of opposed metallized areas 16 can be achieved by arraying the metallized areas in rings coincident with the tings 32 of constant pressure exerted by each fastener 28. In this way, the metallized areas 16 lying in each ring are subjected to the same pressure so that the regions of the anisotropically conductive material 22 (of FIG. 1) in registration with such areas are subjected to substantially uniform compression, assuring a greater uniformity of conduction.

Figure 4:
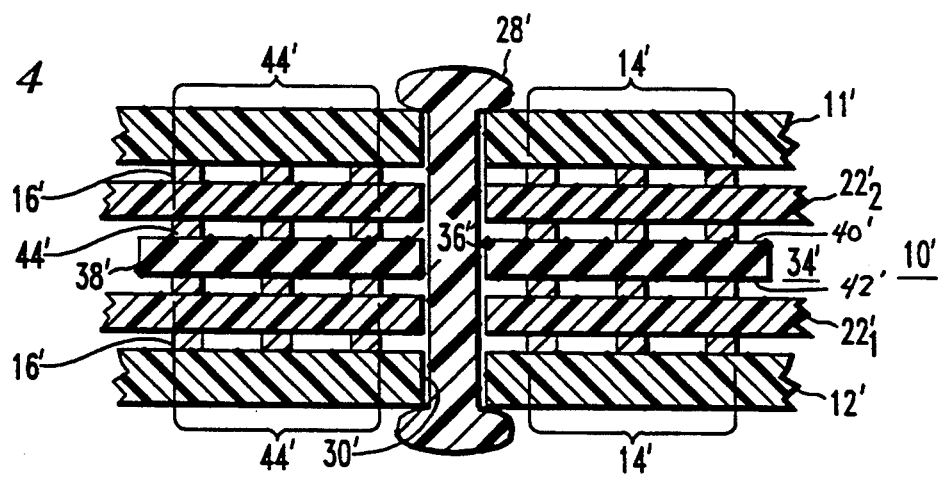
FIG. 4 is a side view, in cross section, of a pair of spaced-apart circuit boards interconnected by the combination of an interposer block and a pair of layers of anisotropically conductive material.

Referring now to FIG. 4, there is shown an alternate preferred embodiment of an assembly 10' which, like the assembly 10 of FIG. 1, is comprised of a pair of circuit boards 11' and 12'. Like the circuit boards 11 and 12 of FIG. 1, the circuit boards 11' and 12' of FIG. 4 each have at least one array 14' of metallized areas 16' opposing the areas on the other board. In accordance with the invention, the metallized areas 16' on each of the circuit boards 11' and 12' are arrayed in one or more tings (not shown), each coincident with a ring of constant pressure exerted by a separate fastener 28' extending through an aperture 30' in each of the boards.

The assembly 10' of FIG. 4 differs from the assembly 10 of FIG. 1 with regard to the spacing between the circuit boards 11' and 12'. The assembly 10 of FIG. 1 is characterized by a relatively small spacing between the circuit boards 11 and 12 (the spacing between the boards corresponding to the thickness of the layer 22 of anisotropically conductive material sandwiched therebetween). In contrast, the spacing between the circuit boards 11' and 12' of FIG. 4 is characterized by a large spacing, typically much larger than the nominal thickness of the layer of anisotropically conductive material 22 of FIG. 1. To obtain the desired spacing between the circuit boards 11' and 12' of FIG. 4, there is sandwiched between the boards a first layer of anisotropically conductive material $22_1'$, an interposer block 34', and a second layer of anisotropically conductive material $22_2'$, each having an opening 36' therethrough sized to receive a separate fastener 28'.

The anisotropically conductive material layers $22_1'$ and $22_2'$ are each configured identically to the anisotropically conductive material 22 of FIG. 1 in that each provides good conductivity along its thickness (z-axis) direction but not through its bulk. The interposer block 34' is typically comprised of at least one, and preferably a plurality of layers 38' of printed wiring board material (e.g., FR-4). The block 34' has a pair of opposed major surfaces 40' and 42', each having at least one array 44' of metallized areas 46' thereon arranged in concentric tings the same as the metallized areas 16' (see FIG. 4) on each of the board 11' and 12'. Each metallized area 46' on each major surface 40' and 42' of the interposer block 34' is interconnected to a corresponding metallized area on the other major surface by a plated through-via (not shown) extending therebetween.

As may now be appreciated, the spacing between the circuit boards 11' and 12' of the assembly 10' of FIG. 4 can be varied by varying the thickness and/or number of layers 38' of the interposer block 34' The larger the number of layers 38' and/or the thicker each layer is, the greater the spacing between the circuit boards 11' and 12'. Note that the spacing between the circuit boards 11' and 12' could also be varied by varying the thickness of the layers $22_1'$ and $22_2'$. However, the cost associated with increasing the thickness of the anisotropically conductive layers $22_1'$ and $22_2'$ is far larger than the cost associated with increasing the thickness and/or number of layers 38' of the interposer block 34'.

The foregoing discloses a technique for better facilitating the interconnection between each of a plurality of metallized areas 16 on opposing circuit boards 11 and 12, via a layer a layer of anisotropically conductive material 22 sandwiched therebetween, by arraying the metallized areas in one or more rings, each concentric about a separate fastener 28 extending through the boards.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for interconnecting each of a first plurality of metallized areas on a first substrate with a corresponding one of a second plurality of metallized areas on an opposed second substrate, comprising the steps of:

interposing at least one layer of anisotropically conductive material between the first and second plurality of metallized areas on the first and second opposed substrates, respectively, to electrically connect each of the first plurality of metallized areas with a separate one of the second plurality of metallized areas;

maintaining the layer of anisotropically conductive material in compression between the first and second substrates by fastening the substrates together via at least one fastener extending into an aperture in the first substrate and through the layer of anisotropically conductive material for receipt in an aperture in the second substrate so that the fastener exerts at least one ring of equal compressive force:

the improvement comprising:

arraying all of the first and second pluralities of metallized areas on each of the first and second opposed substrates, respectively, in at least one ring concentric about the aperture in each substrate which receives each fastener so that said metallized areas in said one ring all lie coincident with a single ring of equal compressive force exerted by a fastener extending through the aperture.

2. The method according to claim 1 wherein the first and second pluralities of metallized areas are each arrayed in a plurality of rings about each aperture in each of the first and second circuit boards, respectively, all of the metallized areas in each ring lying coincident with a single one of the rings of equal compressive force exerted by a fastener.

3. The method according to claim 1 wherein first and a second layers of anisotropically conductive material and an electrically conductive interposer block are sandwiched between the first and second plurality of metallized areas on the first and second opposed substrates, respectively, such that each of the first and second layers of anisotropically conductive material has a first major surface in contact with a separate one of the first and second plurality of metallized areas and a second major surface in contact with a separate one of the first and major second surfaces of the interposer block.

4. An assembly comprising a first substrate having a first plurality of metallized areas on at least one of its major surfaces;

a second substrate having a second plurality of metallized areas on at least one of its major surfaces so that each of the second plurality of metallized areas opposes a corresponding one of the first plurality of metallized areas;

at least one layer of anisotropically conductive material interposed between the first and second substrates; and at least one fastener extending through an aperture in the first substrate for passage through the layer of anisotropically conductive material and into a second aperture in the second substrate so as to exert at least one ring of equal compressive force;

the improvement comprising:

the first and second plurality of metallized areas are all arrayed in at least one ring concentric about each fastener-receiving aperture so that said metallized areas in said one ring all lie coincident with a single ring of equal compressive force exerted by a fastener.

5. The apparatus according to claim 4 wherein the first and second plurality of metallized areas are arrayed in a plurality of rings concentric about each fastener-receiving aperture, all of the metallized areas in each ring lying coincident with a single one of the rings of equal compressive force exerted by the fastener.

6. The apparatus according to claim 4 further including:

a first layer of anisotropically conductive material having a first major surface in contact with the first plurality of metallized area and a second major surface;

a second layer of anisotropically conductive material having a first major surface in contact with the second plurality of metallized areas and a second major surface; and an interposer block sandwiched between the second major surfaces of the first and second layers of anisotropically conductive material to provide an interconnection therebetween.

* * * * *